(12) United States Patent
Lee et al.

(10) Patent No.: US 9,768,399 B2
(45) Date of Patent: Sep. 19, 2017

(54) FLEXIBLE ORGANIC LIGHT EMITTING DISPLAY PANEL

(71) Applicant: LG Display Co., Ltd., Seoul (KR)

(72) Inventors: KwonHyung Lee, Seoul (KR);
Chanwoo Lee, Goyang-si (KR);
Jaekyung Choi, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/984,421

(22) Filed: Dec. 30, 2015

(65) Prior Publication Data
US 2017/0005280 A1    Jan. 5, 2017

(30) Foreign Application Priority Data
Jun. 30, 2015    (KR) .................. 10-2015-0093817

(51) Int. Cl.
*H01L 51/52* (2006.01)
*H01L 27/32* (2006.01)
*H01L 51/00* (2006.01)

(52) U.S. Cl.
CPC .......... *H01L 51/0097* (2013.01); *H01L 27/32* (2013.01); *H01L 27/322* (2013.01); *H01L 27/3276* (2013.01); *H01L 51/5246* (2013.01); *H01L 51/5253* (2013.01); *H01L 2251/5338* (2013.01)

(58) Field of Classification Search
CPC ............ H01L 51/0097; H01L 51/5253; H01L 27/322; H01L 27/3276; H01L 2251/5338
See application file for complete search history.

(56) References Cited

U.S. PATENT DOCUMENTS

| | | | | |
|---|---|---|---|---|
| 2006/0135029 A1* | 6/2006 | Harada | ............... | H01L 51/5253 445/25 |
| 2010/0200846 A1* | 8/2010 | Kwack | ............... | H01L 51/5253 257/40 |
| 2011/0227846 A1* | 9/2011 | Imazeki | .................. | G06F 3/044 345/173 |
| 2014/0167010 A1* | 6/2014 | Jung | .................. | H01L 51/5246 257/40 |

\* cited by examiner

*Primary Examiner* — Caridad Everhart
(74) *Attorney, Agent, or Firm* — Dentons US LLP

(57) ABSTRACT

Disclosed is a flexible organic light emitting display panel in which an upper substrate is larger in size than a lower substrate including a pad area. The flexible organic light emitting display panel includes, for example, a lower substrate, including a flexible lower base film and an organic light emitting diode (OLED) included in the flexible lower base film, and an upper substrate including a flexible upper base film and a multi-buffer which is coated on the flexible upper base film for preventing penetration of water.

6 Claims, 4 Drawing Sheets

FLEXIBLE ORGANIC LIGHT EMITTING DISPLAY PANEL

This application claims the benefit of Korean Patent Application No. 10-2015-0093817 filed on Jun. 30, 2015, which is incorporated herein by reference for all purposes as if fully set forth herein.

BACKGROUND OF THE INVENTION

Field of the Invention

The present invention relates to an organic light emitting display panel and a method of manufacturing the same, and more particularly, to a flexible organic light emitting display panel and a method of manufacturing the same.

Discussion of the Related Art

Display devices such as LCD (Liquid Crystal Display) devices, OLED (Organic Light Emitting Diode) devices, PDP (Plasma Display Panel) devices, and EPD (Electrophoretic Display) devices are manufactured through several steps including an imprinting process to form a pattern on a substrate.

Flat panel display (FPD) apparatuses are applied to various electronic devices such as portable phones, tablet personal computers (PCs), notebook computers, etc. Examples of FPD apparatuses include LCD apparatuses, PDP apparatuses, OLED apparatuses, etc.

Of these FPD apparatuses, OLED apparatuses are a self-emitting device, and thus, have a fast response time, high emission efficiency, high luminance, and a broad viewing angle. As a result, OLED apparatuses are attracting much attention as next-generation FPD apparatuses.

A flexible OLED apparatus including a flexible organic light emitting (OLE) display panel has been developed recently.

Figure 1:
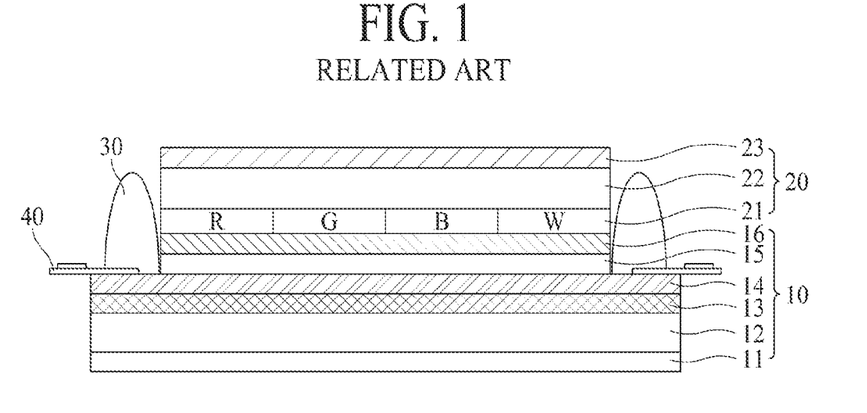
FIG. 1 is a cross-sectional view illustrating a flexible organic light emitting display panel according to the related art.
Figure 2:
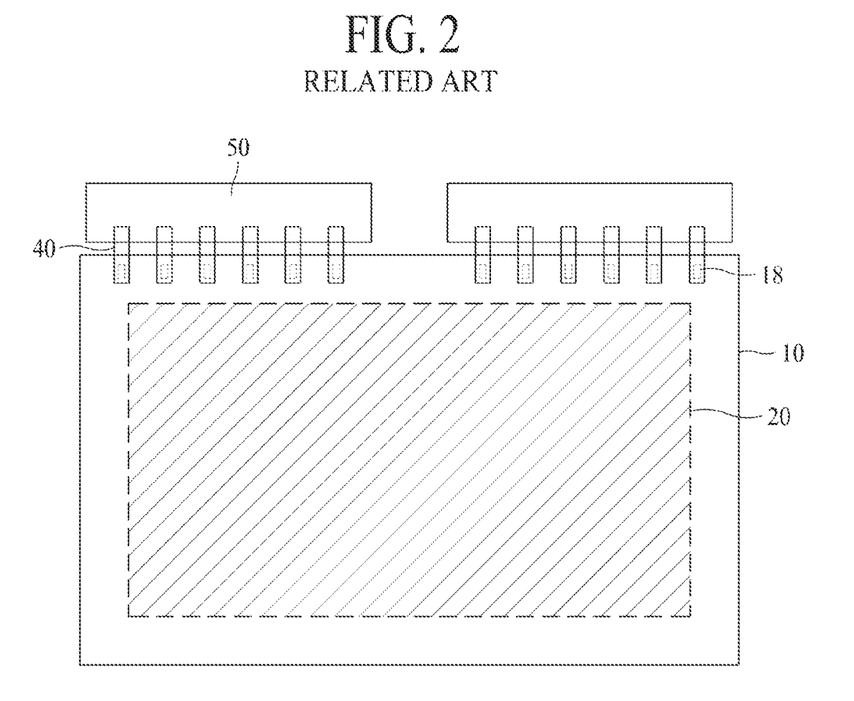
FIG. 2 is a plan view illustrating a flexible organic light emitting display panel according to the related art.

FIG. 1 is a cross-sectional view illustrating a top-emission type flexible OLE display panel according to the related art. FIG. 2 is a plan view illustrating a flexible OLE display panel equipped with a substrate according to the related art.

Flexible OLE display panels may be categorized into a bottom emission type, which outputs light in a lower-end direction as illustrated in FIG. 1, and a top emission type which outputs light in an upper-end direction.

The top emission type flexible OLE display panel, as illustrated in FIG. 1, includes an upper substrate 20, which includes a color filter 21, an upper base substrate (a transparent polyimide (PI)) 22, and a front film 23, and a lower substrate 10 which includes a multi-buffer 13, a thin film transistor (TFT) 14, an organic light emitting diode (OLED) 15, and a sealing material 16. Here, the front film 23 may perform a function of protecting the upper substrate 20.

As illustrated in FIG. 2, the upper substrate 20 is bonded to an active area of the lower substrate 10, and a pad area of the lower substrate 10 is opened for connecting a chip-on film (COF) 40, connected to a printed circuit board (PCB) 50, to a pad 18 included in the lower substrate 10.

The bottom emission type flexible OLE display panel may not need an upper substrate. For example, in the bottom emission type flexible OLE display panel, a color filter and an OLED are stacked on a base substrate, and then, the OLED is sealed by a sealing material. In this case, a reflector is bonded to an upper end surface of the bottom emission type flexible OLE display panel.

The flexible OLE display panel according to the related art may have the following problems.

First, in a glass-type, large-area OLED display, in order to prevent water from penetrating through a side, a thickness of a resin 30 coated on a pad area is desired to be about 400 μm. However, since a thickness of a flexible OLE display panel is thin, a thickness of the resin 30 coated on the pad area of the flexible OLE display panel is typically equal to or less than 70 μm. As a result, it may be difficult to prevent water from penetrating through a side of the flexible OLE display panel.

If a thickness of the flexible OLE display panel is increased for preventing penetration of water, the flexible characteristics of the OLE display panel may be compromised. The resin 30, as illustrated in FIG. 1, may protect a bonding part to which the COF 40 is attached.

Second, due to thermal expansion and contraction characteristics of transparent polyimide (PI) and a stress difference of an inorganic layer which is formed through a high temperature deposition process in a TFT process, when the flexible OLE display panel is released from the base substrate, the pad area may roll up.

Third, due to the resin coated on the pad area for preventing penetration of water, the flexible OLE display panel may cling to a chuck during a release and back film lamination process.

Fourth, a film may be attached to an upper end surface of the flexible OLE display panel for preventing water from penetrating through a side. However, due to the resin coated on the pad area, the film may not be completely attached to the side of the flexible OLE display panel. Moreover, when the resin is covered by the film, bubbles may occur in the resin.

Fifth, several to several tens of COFs equipped with a source driver integrated circuit (IC) are attached to the pad area for connecting the source driver IC to the flexible OLE display panel. A process of aligning an electrode pad provided on each of the COFs and an electrode pad provided in the pad area is typically needed. For example, as illustrated in FIG. 2, when twelve COFs 140 are attached to the flexible OLE display panel, twelve alignment processes may be needed. Moreover, an alignment process of attaching the twelve COFs 140 to the PCB 50 may be needed, which also may require an alignment margin between the electrode pads.

Sixth, in the bottom emission type flexible OLE display panel, a process of attaching a reflector (for example, a face seal metal (FSM) or a metal sheet)) to the upper end surface of the flexible OLE display panel may be needed. As a result, the manufacturing process may become complicated, and the manufacturing cost may increase.

Seventh, in the bottom emission type flexible OLE display panel, as illustrated in FIG. 2, the upper substrate 20 is bonded to the active area of the lower substrate 10. As a result, a process of aligning the upper substrate 20 to the active area of the lower substrate 10 may be needed.

SUMMARY OF THE INVENTION

Accordingly, the present invention is directed to a flexible organic light emitting display device and a method of manufacturing the same that substantially obviate one or more problems due to limitations and disadvantages of the related art.

An advantage of the present invention is to provide a flexible organic light emitting display panel in which an upper substrate is larger in size than a lower substrate including a pad area.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a flexible organic light emitting display panel may, for example, include a lower substrate including a flexible lower base film and an organic light emitting diode (OLED) on the flexible lower base film, wherein the lower substrate includes an active area on which the OLED is disposed and an inactive area surrounding the active area; an upper substrate including a flexible upper base film and a multi-buffer which is coated on the flexible upper base film; and a plurality of pad electrodes in a pad area of the inactive area, the plurality of pad electrodes electrically connected to a plurality of data lines disposed in the active area, wherein the upper substrate includes an area of the inactive area of the lower substrate except the pad area, a cover area corresponding to the active area, and a connection area covering the pad area.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the present invention, examples of which are illustrated in the accompanying drawings.

Wherever possible, the same reference numbers will be used throughout the drawings to refer to the same or like parts.

Figure 3:
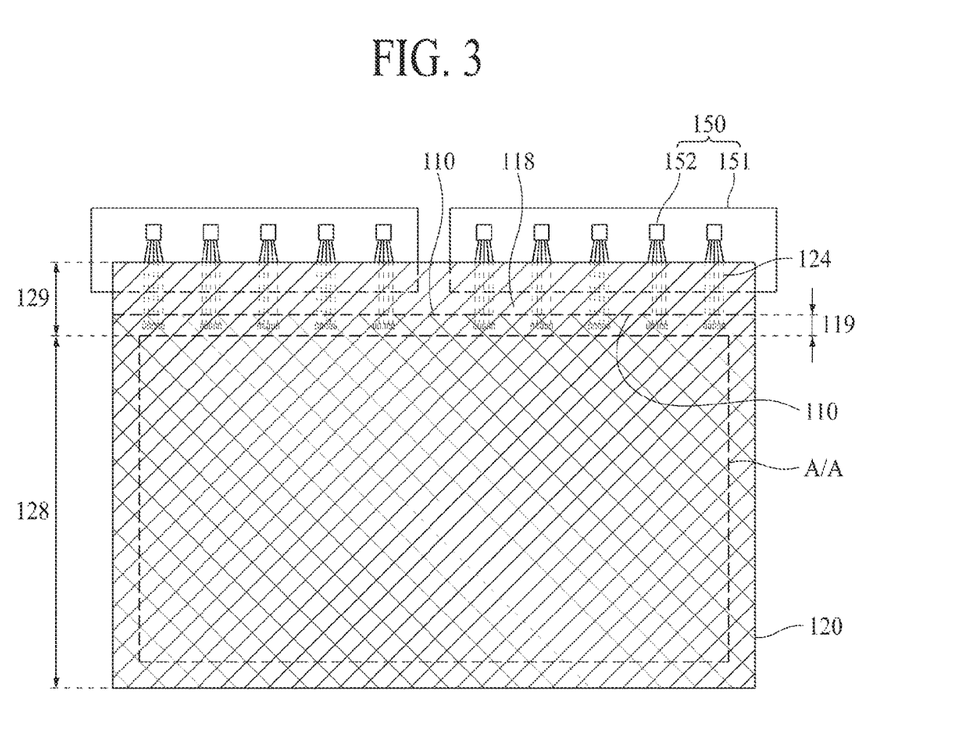
FIG. 3 is a plan view illustrating a flexible organic light emitting display panel according to an embodiment of the present invention.

FIG. 3 is a plan view of a flexible organic light emitting (OLE) display panel according to an embodiment of the present invention.

The flexible OLE display panel according to an embodiment of the present invention may include a lower substrate 110, which includes a flexible lower base film and an organic light emitting diode (OLED) included in the flexible lower base film, and an upper substrate 120 which includes a flexible upper base film and a multi-buffer which is coated on the flexible upper base film for reducing or preventing penetration of water.

The lower substrate 110 may include an active area A/A, where the organic light emitting diode is disposed, and an inactive area surrounding the active area. A plurality of pad electrodes 118 connected to a plurality of data lines disposed in the active area A/A may be disposed in a pad area 119 of the inactive area.

The upper substrate 120 may include an area of the inactive area of the lower substrate 110 except the pad area 119, a cover area 128 corresponding to the active area A/A, and a connection area 129 that covers the pad area 119. The lower substrate 110 may be bonded to the upper substrate 120 by an adhesive material which is coated on the cover area 128 of the upper substrate 120.

A plurality of connection lines 124 corresponding to the pad electrodes 118 may be disposed in the connection area 129 of the upper substrate 120. In this case, the pad electrodes 118 may be electrically connected to the connection lines 124 by an anisotropic conductive film (ACF). The connection lines 124 may be electrically connected to a PCB 150 equipped with a data driver IC 152. The PCB 150 may include the data driver IC 152 and a substrate 151 equipped with the data driver IC 152. A plurality of wiring for connecting the connection lines 124 to the data driver IC 152 may be disposed on the substrate 151.

Alternatively, the pad electrodes 118 may be electrically connected to a COF equipped with a data driver IC. The COF may be electrically connected to a PCB on which various electric circuits for driving the flexible OLE display panel are disposed. Also, the connection lines 124 may be electrically connected to the COF equipped with the data driver IC. The COF may be electrically connected to the PCB on which the various electric circuits for driving the flexible OLE display panel are disposed.

A plurality of gate lines and a plurality of data lines may be disposed in the active area A/A, and a plurality of pixels defined by crossings of the gate lines and the data lines may also be provided in the active area A/A.

A gate driver for sequentially supplying a scan pulse to the gate lines may be disposed in the inactive area of the lower substrate 110. The gate driver may sequentially supply a scan pulse to the gate lines in response to a gate control signal input from a timing controller which may be disposed on the PCB 150 or in the inactive area.

A plurality of switching transistors, which are respectively formed in pixels of a corresponding horizontal line receiving the scan pulse, may be turned on by the scan pulse, and thus, an image may be displayed on each of the pixels. The gate driver may be provided independently from the lower substrate 110 and may be electrically connected to the lower substrate 110 by various methods. However, the gate driver may be provided in a gate-in panel (GIP) type where the gate driver is disposed in the inactive area. Hereinafter, a flexible OLE display panel where the gate driver is disposed on the lower substrate 110 by using the GIP type will be described as an example of the present invention.

The timing controller may output the gate control signal for controlling the gate driver and a data control signal for controlling the data driver IC 152 by using a vertical synchronization signal, a horizontal synchronization signal, a clock, and/or the like which are supplied from an external system (not shown). The timing controller may sample input image data received from an external system, realigns the sampled image data, and supplies the realigned digital image data to the data driver IC 152. The timing controller may be disposed on the PCB 150 or in the inactive area.

The data driver IC 152 for supplying data voltages to the data lines may be mounted on the PCB 150. The data driver IC 152 may convert the image data, input from the timing controller, into analog data voltages, and may respectively supply data voltages for one horizontal line to the data lines at every one horizontal period where the scan pulse is supplied to a corresponding gate line. That is, the data driver IC 152 may convert the image data into the data voltages by using gamma voltages supplied from a gamma voltage generator (not shown), and may respectively output the data voltages to the data lines. However, as described above, the data driver IC 152 may be disposed on a COF connected to the pad electrode 118, or may be disposed on a COF connected to the connection line 124.

The OLED emitting light and a pixel driver for driving the OLED may be disposed in each pixel provided in the active area A/A. The OLED may be implemented in a top emission type where the light emitted from the OLED is output to the outside through the upper substrate 120, or may be implemented in a bottom emission type where the light emitted from the OLED is output to the outside through the lower substrate 110. An anode of the OLED may be connected to a first power source, and a cathode may be connected to a second power source. The OLED may emit light having a certain luminance corresponding to a level of current supplied from a driving transistor disposed in the pixel driver.

The pixel driver may include two or more TFTs and a storage capacitor which are connected to the data line and the gate line to control driving of the OLED. When the scan pulse is supplied to the gate line, the pixel driver may control an amount of current supplied to the OLED according to a data voltage supplied to the data line. To this end, the driving transistor may be connected between the first power source and the OLED, and the switching transistor may be connected to the driving transistor, the data line DL, and the gate line GL.

Hereinabove, it has been described that the data driver IC 152, the gate driver, and the timing controller are separately provided. However, at least one of the data driver IC 152 and the gate driver may be implemented as one body with the timing controller.

Figure 4:
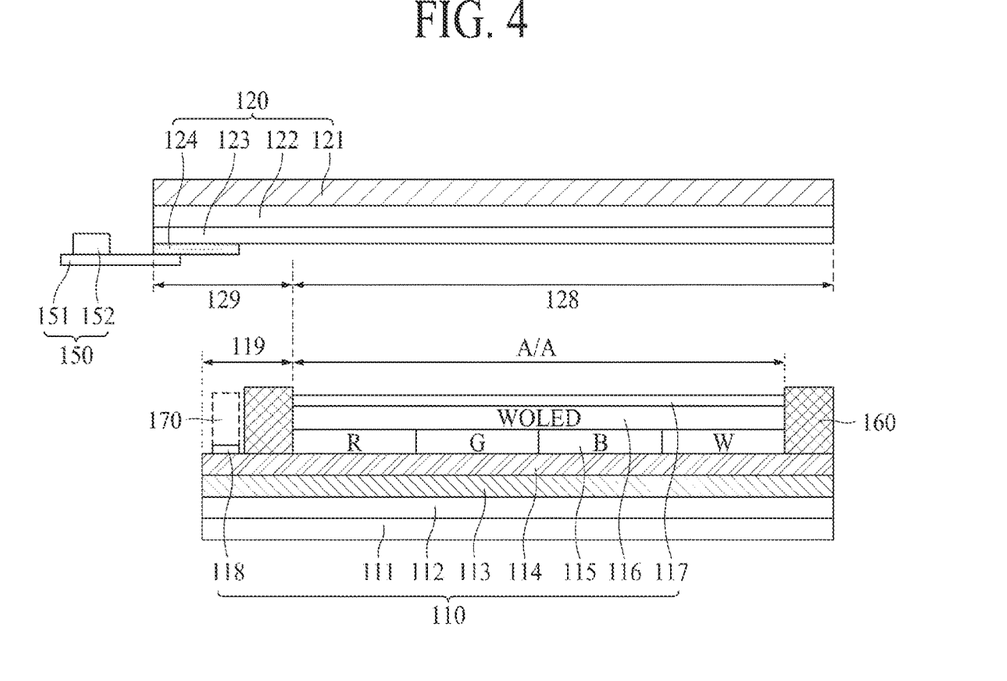
FIG. 4 is an exemplary diagram illustrating an upper substrate and a lower substrate of a flexible organic light emitting display panel according to the first embodiment of the present invention.
Figure 5:
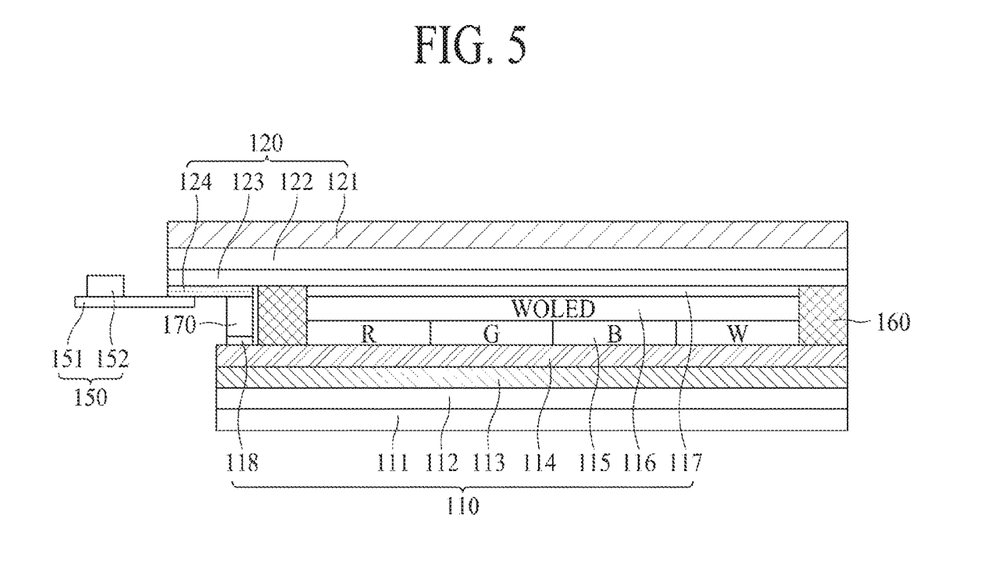
FIG. 5 is a cross-sectional view of a flexible organic light emitting display panel according to the first embodiment of the present invention.

FIG. 4 is an exemplary diagram illustrating an upper substrate and a lower substrate of a flexible OLE display panel according to the first embodiment of the present invention, and FIG. 5 is a cross-sectional view of the flexible OLE display panel according to the first embodiment of the present invention.

The flexible OLE display panel may be manufactured in the bottom emission type where light is output in a lower-end direction, or may be manufactured in the top emission type where light is output in an upper-end direction.

The flexible OLE display panel based on the bottom emission type according to the first embodiment of the present invention is illustrated in FIGS. 4 and 5 by way of example.

The flexible OLE display panel may include a lower substrate 110, which includes a flexible lower base film 112 and an OLED 116 on the flexible lower base film 112, and an upper substrate 120 which includes a flexible upper base film and a multi-buffer which is coated on the flexible upper base film for reducing or preventing penetration of water.

In particular, the lower substrate 110 may include the lower base film 112, a multi-buffer 113 disposed on the lower base film 112, a TFT 114 included in the multi-buffer 113, a color filter 115 disposed on the TFT 114, the OLED 116 disposed on the color filter 115, and a sealing material 117 that seals the OLED 116.

First, the lower base film 112 may be formed on an auxiliary substrate, which includes a base substrate such as a glass substrate and a sacrificial layer during a process of manufacturing the flexible OLE display panel. A material of the lower base film 112 may be plastic such as polyimide (PI). After the lower substrate 110 may be finished, the auxiliary substrate may be stripped from the lower substrate 110. After the auxiliary substrate is removed, a back film 111 may be attached to a bottom of the lower base film 112.

The lower base film 112 may be formed of one of polyethersulphone (PES), polyacrylate (PAR), polyetherimide (PEI), polyethyelenen napthalate (PEN), polyethyelene terephthalate (PET), polyphenylene sulfide (PPS), polyallylate, polyimide, polycarbonate (PC), cellulous tree acetate (TAC), and cellulose acetate propionate (CAP). The lower base film 112 may be formed by, for example, a spin coating process.

In detail, a liquid material including one of the above-described materials may be coated on the sacrificial layer configuring the auxiliary substrate, and then, the lower base film 112, which is thin and uniform in thickness, may be formed by rotating the glass substrate configuring the auxiliary substrate at a high speed. The lower base film 112 may also be formed by a roll coating process and a slit coating process. The two processes may enhance production efficiency.

Second, the multi-buffer 113 may perform an encapsulation function. That is, since the lower base film 112 uses flexible plastic, the multi-buffer 113 may be disposed on the lower base film 112 for reducing or preventing penetration of water. The multi-buffer 113 may be formed of at least one layer including an organic material such as a resin and/or the like for reducing or preventing undesired particles or static electricity from occurring or may be formed of at least one layer including an inorganic material such as $Al_2O_3$, $SiO_2$, and/or the like for reducing or preventing water by using a barrier.

Third, the TFT 114 may be the driving transistor or the switching transistor. The TFT 114 may be disposed in each of the pixels.

Fourth, the color filter 115 may be disposed on the TFT 114. A planarization layer or a passivation layer may be formed between the TFT 114 and the color filter 115.

The color filter 115 may be disposed in correspondence with each pixel. The color filter 115 may be a white color filter W, a red color filter R, a green color filter G, or a blue color filter B. The white color filter W may be omitted, and in addition to the colors, a color filter having another color may be disposed on the TFT 114.

In detail, a plurality of pixels may be disposed in the active area A/A, and a pixel driver including the TFT 114 may be disposed in each of the pixels. Also, the color filter 115 having one color may be disposed in each of the pixels.

Fifth, the OLED may be disposed on the color filter 115. In this case, the OLED may emit a white color, and in FIGS. 4 and 5, a white OLED (WOLED) 116 is thus illustrated by way of example. Hereinafter, the WOLED 116 may be simply referred to as an OLED.

The OLED 116 may include a first electrode (for example, an anode electrode), a second electrode (for example, a cathode electrode), and an emission part. The first electrode may be connected to the driving transistor.

Sixth, the OLED 116 may be sealed by the sealing material 117. The sealing material 117 protects the OLED 116 from penetration of water. The sealing material 117 may be configured by using the same material and process for sealing the OLED of the OLE display panel according to the related art.

The lower substrate 110 may include an active area A/A, where the OLED is disposed, and an inactive area surrounding the active area A/A.

A plurality of pad electrodes 118 connected to a plurality of data lines disposed in the active area A/A may be disposed in the pad area 119 of the inactive area.

The lower substrate 110 may be bonded to an adhesive material 160 coated on the cover area 128 of the upper substrate 120. In this case, the adhesive material 160 may be coated on a whole surface of the lower substrate 110 except the pad area 119. In FIGS. 4 and 5, it is illustrated that the adhesive material 160 is coated on the inactive area of the lower substrate 110. However, as described above, the adhesive material 160 may be coated on the lower substrate 110, or may be coated on the upper substrate 120.

The adhesive material 160 may be a resin (for example, an optical clear resin (OCR)) having adhesiveness, or may be a film (for example, an optical clear adhesive (OCA)) having adhesiveness.

As illustrated in FIGS. 4 and 5, the upper substrate 120 may include the upper base film 121 and a multi-buffer 122 coated on the upper base film 121.

The upper base film 121 may be formed of the same material as that of the lower base film 112. The multi-buffer 122 may reduce or prevent water from penetrating into the OLED 116 through the upper base film 121 in a state where the upper substrate 120 is bonded to the lower substrate 110. To this end, the multi-buffer 122 may be formed of at least one layer including an organic material such as a resin and/or the like, or may be formed of at least one layer including an inorganic material such as $Al_2O_3$, $SiO_2$, and/or the like for reducing or preventing water by using a barrier.

A plurality of lines which perform various functions may be disposed on an upper end (e.g., a surface of the multi-buffer 122 facing the lower substrate 110) of the multi-buffer 122. When the plurality of lines are provided, a planarization layer 123 may be coated on the plurality lines.

The upper substrate 120 may include an area of the inactive area of the lower substrate 110 except the pad area 119, a cover area 128 corresponding to the active area A/A, and a connection area 129 that covers the pad area 119.

A plurality of connection lines 124 corresponding to the pad electrodes 118 may be disposed in the connection area 129 of the upper substrate 120. In this case, the pad electrodes 118 may be electrically connected to the connection lines 124 by an anisotropic conductive film (ACF). The connection lines 124 may be electrically connected to a PCB 150 equipped with a data driver IC 152.

Figure 6:
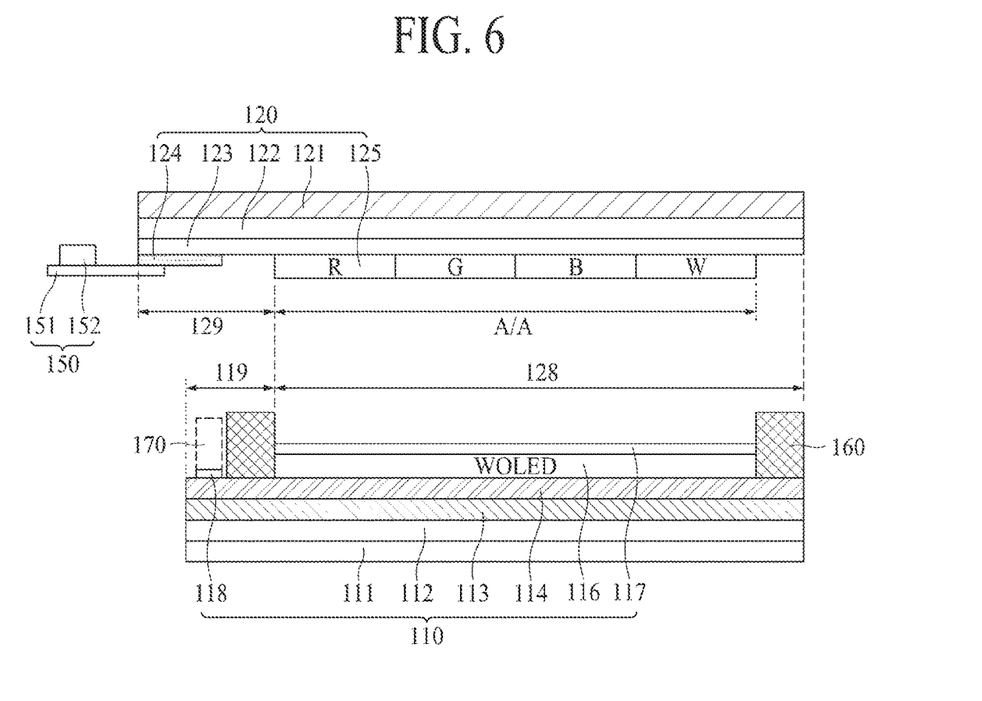
FIG. 6 is an exemplary diagram illustrating an upper substrate and a lower substrate of a flexible organic light emitting display panel according to the second embodiment of the present invention.
Figure 7:
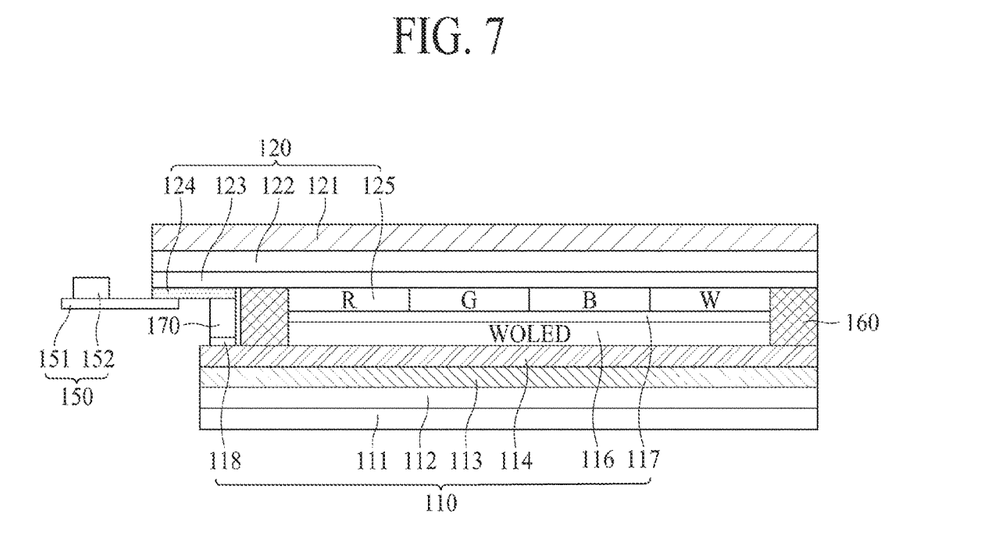
FIG. 7 is a cross-sectional view of a flexible organic light emitting display panel according to the second embodiment of the present invention.

FIG. 6 is an exemplary diagram illustrating an upper substrate and a lower substrate of a flexible OLE display panel according to the second embodiment of the present invention, and FIG. 7 is a cross-sectional view of the flexible OLE display panel according to the second embodiment of the present invention.

The flexible OLE display panel according to the second embodiment may be manufactured by using the bottom emission type where light is output in a lower-end direction, or may be manufactured by using the top emission type where light is output in an upper-end direction.

The flexible OLE display panel based on the bottom emission type according to the first embodiment of the present invention has been described above with reference to FIGS. 4 and 5. By way of example, the flexible OLE display panel based on the top emission type according to the second embodiment of the present invention will now be described with reference to FIGS. 6 and 7. A repetitive description of the same or similar elements as those in the first embodiment will be omitted or briefly described.

The flexible OLE display panel may include a lower substrate 110, which includes a flexible lower base film 112 and an OLED 116 on the flexible lower base film 112, and an upper substrate 120 which includes a flexible upper base film and a multi-buffer which is coated on the flexible upper base film for reducing or preventing penetration of water.

As illustrated in FIGS. 6 and 7, the lower substrate 110 may include the lower base film 112, a multi-buffer 113 disposed on the lower base film 112, a TFT 114 included in the multi-buffer 113, the OLED 116 disposed on the TFT 114, and a sealing material 117 that seals the OLED 116.

First, the lower base film 112 may perform the same function as that of the lower base film described in the first embodiment and may be formed of the same material through the same process as those of the lower base film described in the first embodiment. A back film 111 may be attached to a bottom of the lower base film 112.

Second, the multi-buffer 113 may perform an encapsulation function. The multi-buffer 113 may perform the same function as that of the multi-buffer described in the first embodiment and may be formed of the same material as that of the multi-buffer described in the first embodiment through the same process.

Third, the TFT 114 may be the driving transistor or the switching transistor. The TFT 114 may be disposed in each of the pixels.

Fourth, the OLED 116 may be disposed on the TFT 114. In this case, the OLED may have a white or other various color. However, since a color filter 125 is formed on the upper substrate 120 as illustrated in FIGS. 6 and 7, the OLED 116 may be an WOLED. Hereinafter, the WOLED 116 may be simply referred to as an OLED.

The OLED 116 may perform the same function as that of the OLED 116 described in the first embodiment and may be formed of the same material as that of the OLED 116 described in the first embodiment through the same process.

Sixth, the OLED 116 may be sealed by the sealing material 117. The sealing material 117 protects the OLED 116 from penetration of water. The sealing material 117 may be configured by using the same material and the same process for sealing the OLED in the OLE display panel according to the related art.

The lower substrate 110 may include an active area A/A, where the OLED is disposed, and an inactive area surrounding the active area A/A.

A plurality of pad electrodes 118 connected to a plurality of data lines disposed in the active area A/A may be disposed in the pad area 119 of the inactive area.

The lower substrate 110 may be bonded to an adhesive material 160 coated on the cover area 128 of the upper substrate 120. In this case, the adhesive material 160 may be coated on a whole surface of the lower substrate 110 except the pad area 119. In FIGS. 6 and 7, it is illustrated that the adhesive material 160 is coated on the inactive area of the lower substrate 110. However, as described above, the adhesive material 160 may be coated on the lower substrate 110, or may be coated on the upper substrate 120.

The adhesive material 160 may be a resin (for example, an optical clear resin (OCR)) having adhesiveness, or may be a film (for example, an optical clear adhesive (OCA)) having adhesiveness.

As illustrated in FIGS. 6 and 7, the upper substrate 120 may include the upper base film 121, a multi-buffer 122 coated on the upper base film 121, and a color filter 125 disposed on the multi-buffer 122. The upper base film 121 may be formed of the same material as that of the lower base film 112.

The multi-buffer 122 may reduce or prevent water from penetrating into the OLED 116 through the upper base film 121 in a state where the upper substrate 120 is bonded to the lower substrate 110. To this end, the multi-buffer 122 may be formed of at least one layer including an organic material such as a resin and/or the like, or may be formed of at least one layer including an inorganic material such as $Al_2O_3$, $SiO_2$, and/or the like for reducing or preventing water by using a barrier.

A plurality of lines which perform various functions may be disposed on an upper end (e.g., a surface of the multi-buffer 122 facing the lower substrate 110) of the multi-buffer 122. When the plurality lines are provided, a planarization layer 123 may be coated on the plurality lines.

The color filter 125 may be disposed on the multi-buffer 122 or the planarization layer 123. The color filter 125 may be disposed in correspondence with each pixel. The color filter 125 may be a white color filter W, a red color filter R, a green color filter G, or a blue color filter B. The white color filter W may be omitted, and in addition to the colors, a color filter having another color may be disposed on the TFT 114.

In detail, a plurality of pixels may be disposed in the active area A/A, and a pixel driver including the TFT 114 may be disposed in each of the pixels. Also, the color filter 125 having one color may be disposed in each of the pixels.

The upper substrate 120 may include an area of the inactive area of the lower substrate 110 except the pad area 119, a cover area 128 corresponding to the active area A/A, and a connection area 129 that covers the pad area 119.

A plurality of connection lines 124 corresponding to the pad electrodes 118 may be disposed in the connection area 129 of the upper substrate 120. In this case, the pad electrodes 118 may be electrically connected to the connection lines 124 by an anisotropic conductive film (ACF). The connection lines 124 may be electrically connected to a PCB 150 equipped with a data driver IC 152.

According to the embodiments of the present invention, the upper substrate 120 may extend to an outer portion of the active area A/A of the lower substrate 110 on which the OLED 116 is disposed. Also, a COF and a reflector may be omitted, and thus, the manufacturing cost can be reduced.

Moreover, according to the embodiments of the present invention, a penetration of water through a side may be reduced or prevented. For example, since the multi-buffer 122 is included in the upper substrate 120, a penetration of water into the OLED 116 through the upper base substrate 121 can be blocked by the multi-buffer 122.

In the related art organic light emitting display panel, as illustrated in FIG. 1, since an area on which the resin 30 is coated is exposed, water can penetrate into the OLED 116 through the resin 30. However, according to the embodiments of the present invention, because the upper substrate 120 covers a whole surface of the lower substrate 110, and because the multi-buffer 122 included in the upper substrate 120 covers the whole surface of the lower substrate 110, a penetration of water into the OLED 116 through the upper substrate 120 can be blocked by the multi-buffer 122. In this case, water may penetrate through a side (e.g., a side of the flexible OLE display panel) of an area on which the adhesive material 160 is coated, but the adhesive material 160 can reduce or prevent a penetration of water.

Also, a width of the area on which the adhesive material 160 is coated is greater than a thickness of the upper substrate 120. As a result, an influence of water penetration through the upper substrate 120 is greater than an influence of water penetration through the side of the flexible OLE display panel. However, according to the embodiments of the present invention, the multi-buffer 122 included in the upper substrate 120 may reduce or prevent water from penetrating through the upper substrate 120.

Moreover, according to the embodiments of the present invention, a process of bonding the flexible OLE display panel to the PCB 150 on which various driving elements are disposed may be stably and simply performed.

According to the embodiments of the present invention, the upper substrate 120 may cover the active area A/A of the lower substrate 110, the inactive area provided outside the active area A/A, and the pad area 119 disposed in the inactive area. The connection lines 124 may be provided in the connection area 129, corresponding to the pad area 119, of the upper substrate 120, and the connection lines 124 may be electrically connected to the lines provided on PCB 150 on which the various driving elements and the source driver IC 152 are disposed. As a result, a COF may not be used. Accordingly, an alignment process of attaching the COF to the pad area 119 included in the lower substrate 110 may be omitted, and thus, the manufacturing process of the flexible OLE display panel may be simplified.

According to the embodiments of the present invention, a bonding difference between the upper substrate 120 and the lower substrate 110 may be managed within a range of ±5 μm, and thus, an alignment process may not be additionally performed in bonding the pad area 119 to the connection area 129. Also, when the PCB 150 is aligned in the connection area 129, the lines provided on the PCB 150 and the connection lines 124 provided on the connection area 129 may be automatically aligned. The lines provided on the PCB 150 may be electrically connected to the data driver IC 152 and the connection lines 124. However, the connection area 129 may not be included in the upper substrate 120. For example, if the connection area 129 is not included in the upper substrate 120, a COF may be attached to the pad area 119.

According to the embodiments of the present invention, the multi-buffer 122 may be coated on a surface of the upper substrate 120 bonded to the lower substrate 110. As a result, a water penetration through a side of the flexible OLE display panel can be reduced or prevented, thereby enhancing the flexible OLE display panel. More specifically, since a water penetration path is lengthened due to the multi-buffer 122 included in the upper substrate 120, a water penetration through a side of the flexible OLE display panel may be blocked by the multi-buffer 122.

In a case where the flexible OLE display panel according to the embodiments of the present invention is a top emission type and a thickness of the upper base film 121 is about 150 μm, the upper base film may perform a function of an upper plate protection film of the flexible OLE display panel according to the related art. Accordingly, according to the embodiments of the present invention, the upper plate protection film may be omitted, and thus, a thickness of the flexible OLE display panel can be reduced compared to the flexible OLE display panel according to the related art.

In a case where the flexible OLE display panel according to the embodiments of the present invention is a bottom emission type, the upper base film 121 may perform a function of a reflector of the flexible OLE display panel according to the related art. Accordingly, according to the embodiments of the present invention, a thickness of the flexible OLE display panel can be reduced compared to the flexible
OLE display panel according to the related art.

More specifically, the upper base film 121 is set with a high thickness, the upper plate protection film and the reflector applied to the related art flexible OLE display panel may be omitted, and thus, a thickness of the flexible OLE display panel is reduced and its manufacturing process can be simplified.

According to the embodiments of the present invention, the resin 30 coated on the related art flexible OLE display panel may not be coated for reducing or preventing water from penetrating through a side of the flexible OLE display panel and for protecting a COF bonded to the pad area. Accordingly, a process of coating the resin 30 may be omitted, and thus, the manufacturing process of the flexible OLE display panel can be simplified.

According to the embodiments of the present invention, the pad area 119 of the lower substrate 110 may be bonded to the upper substrate 120. Accordingly, the pad area may not roll up as it may in the related art flexible OLE display panel.

According to the embodiments of the present invention, the adhesive material 160 for bonding the upper substrate 120 to the lower substrate 110 may be coated on a whole area of each of the upper substrate 120 and the lower substrate 110 except the pad area 119 and the connection area 129.

According to the embodiments of the present invention, since the upper base film 121 is flexible, the connection area 129 may be bent. As a result, the upper substrate may be bonded to the lower substrate by the adhesive material 160, and then, in a state where the connection area 129 is bent in a direction opposite to the pad area 119, the ACF 170 may be attached to the pad area 119. After the ACF 170 is attached to the pad area 119, the connection area 120 may be restored to an original state, and thus, the connection area 129 may be attached to the ACF 170. Accordingly, the pad electrode 118 included in the pad area 119 may be electrically connected to the connection line 124 disposed in the connection area 129.

According to the embodiments of the present invention, as described above, the upper plate protection film or the reflector may be omitted. As a result, a foreign material may not be adhered to a surface of the flexible OLE display panel during a process of attaching the upper plate protection film or the reflector. Accordingly, a dark spot may not occur in the flexible OLE display panel, thereby improving yield rate.

According to the embodiments of the present invention, as described above, a COF, a reflector and an anti-moisture resin may be omitted. Accordingly, the manufacturing process can be simplified, and the manufacturing cost can be reduced.

According to the embodiments of the present invention, since a water penetration through a side can be reduced or prevented, the reliability of the flexible OLE display panel can be improved. Also, since a COF may be omitted, a process of aligning COFs on the flexible OLE display panel and a process of aligning COFs on a PCB may be omitted.

In addition, since a lower substrate is bonded to an upper substrate by using a key alignment method, a tab bonding process can be simplified. Moreover, a reflector as well as a front film for protecting an upper substrate may be omitted. Accordingly, a thickness of the flexible OLE display panel can be reduced.

It will be apparent to those skilled in the art that various modifications and variation can be made in the present invention without departing from the concepts and scope of the invention. Thus, it is intended that the present invention cover the modifications and variations of this invention provided they come within the scope of the appended claims and their equivalents.

What is claimed is:

1. A flexible organic light emitting display panel comprising:
   a lower substrate including a flexible lower base film and an organic light emitting diode (OLED) on the flexible lower base film, wherein the lower substrate includes an active area on which the OLED is disposed and an inactive area surrounding the active area;
   an upper substrate including a flexible upper base film and a multi-buffer which is coated on the flexible upper base film; and
   a plurality of pad electrodes in a pad area of the inactive area of the lower substrate, the plurality of pad electrodes electrically connected to a plurality of data lines disposed in the active area,
   wherein the upper substrate includes an area covering a part of the inactive area of the lower substrate except the pad area, a cover area corresponding to the active area, and a connection area covering the pad area,
   wherein a plurality of connection lines corresponding to the plurality of pad electrodes are disposed in the connection area of the upper substrate that extends farther than the pad area of the lower substrate, and the plurality of pad electrodes are electrically connected to the plurality of connection lines.

2. The flexible organic light emitting display panel of claim 1, wherein the lower substrate is bonded to the upper substrate by an adhesive material coated on the cover area of the upper substrate.

3. The flexible organic light emitting display panel of claim 1, wherein the plurality of pad electrodes are electrically connected to the plurality of connection lines by an anisotropic conductive film (ACF).

4. The flexible organic light emitting display panel of claim 3, wherein the plurality of connection lines are electrically connected to a printed circuit board (PCB) equipped with a data driver integrated circuit (IC).

5. A flexible organic light emitting display panel comprising:
   a lower substrate including a flexible lower base film and an organic light emitting diode (OLED) on the flexible lower base film, wherein the lower substrate includes an active area on which the OLED is disposed and an inactive area surrounding the active area;
   an upper substrate including a flexible upper base film and a multi-buffer which is coated on the flexible upper base film; and
   a plurality of pad electrodes in a pad area of the inactive area, the plurality of pad electrodes electrically connected to a plurality of data lines disposed in the active area,
   wherein the upper substrate includes an area of the inactive area of the lower substrate except the pad area, a cover area corresponding to the active area, and a connection area covering the pad area, and wherein the lower substrate comprises:

a thin film transistor (TFT) disposed on the flexible lower base film;

a color filter disposed on the TFT;

the OLED disposed on the color filter; and a sealing material sealing the OLED.

6. A flexible organic light emitting display panel comprising:

a lower substrate including a flexible lower base film and an organic light emitting diode (OLED) on the flexible lower base film, wherein the lower substrate includes an active area on which the OLED is disposed and an inactive area surrounding the active area;

an upper substrate including a flexible upper base film and a multi-buffer which is coated on the flexible upper base film; and a plurality of pad electrodes in a pad area of the inactive area, the plurality of pad electrodes electrically connected to a plurality of data lines disposed in the active area, wherein the upper substrate includes an area of the inactive area of the lower substrate except the pad area, a cover area corresponding to the active area, and a connection area covering the pad area, and wherein the lower substrate comprises:

a thin film transistor (TFT) disposed on the flexible lower base film;

a color filter disposed on the TFT;

the OLED disposed on the color filter; and a sealing material sealing the OLED, and the upper substrate comprises:

the flexible upper base film;

the multi-buffer coated on the flexible upper base film; and a color filter disposed on the multi-buffer.

* * * * *